(12) United States Patent
Forster

(10) Patent No.: US 7,477,152 B2
(45) Date of Patent: Jan. 13, 2009

(54) RFID APPLICATION TEST SYSTEMS AND METHODS

(75) Inventor: Ian J. Forster, Chelmsford (GB)

(73) Assignee: Avery Dennison Corporation, Pasadena, CA (US)

( * ) Notice: Subject to any disclaimer, the term of this patent is extended or adjusted under 35 U.S.C. 154(b) by 337 days.

(21) Appl. No.: 11/370,459

(22) Filed: Mar. 8, 2006

(65) Prior Publication Data

US 2006/0202705 A1  Sep. 14, 2006

Related U.S. Application Data

(60) Provisional application No. 60/661,412, filed on Mar. 14, 2005.

(51) Int. Cl.
*G08B 13/14* (2006.01)
(52) U.S. Cl. ............... 340/572.8; 340/572.1; 340/572.7
(58) Field of Classification Search ............. 340/572.1, 340/572.3, 572.4, 572.5, 572.7, 572.8, 10.1, 340/539.13, 571; 235/383, 385, 378; 714/25
See application file for complete search history.

(56) References Cited

U.S. PATENT DOCUMENTS

| | | | |
|---|---|---|---|
| 4,802,216 A | | 1/1989 | Irwin et al. |
| 5,613,228 A | | 3/1997 | Tuttle et al. |
| 5,983,363 A | * | 11/1999 | Tuttle et al. .................... 714/25 |
| 6,104,291 A | * | 8/2000 | Beauvillier et al. ...... 340/572.1 |
| 6,184,777 B1 | * | 2/2001 | Mejia ........................ 340/10.1 |
| 6,219,543 B1 | | 4/2001 | Myers et al. |
| 6,236,223 B1 | | 5/2001 | Brady et al. |
| 6,246,326 B1 | | 6/2001 | Wiklof et al. |
| 6,346,881 B1 | | 2/2002 | Davidson |
| 6,409,401 B1 | | 6/2002 | Petteruti et al. |
| 6,412,086 B1 | | 6/2002 | Friedman et al. |
| 6,445,297 B1 | | 9/2002 | Nicholson |
| 6,486,769 B1 | | 11/2002 | McLean |
| 6,487,681 B1 | | 11/2002 | Tuttle et al. |
| 6,545,605 B2 | | 4/2003 | Van Horn et al. |
| 6,593,853 B1 | | 7/2003 | Barrett et al. |
| 6,784,789 B2 | | 8/2004 | Eroglu et al. |
| 6,806,812 B1 | | 10/2004 | Cathey |
| 6,943,688 B2 | * | 9/2005 | Chung et al. ............. 340/572.7 |
| 7,132,946 B2 | | 11/2006 | Waldner et al. |
| 2001/0002106 A1 | | 5/2001 | Tuttle et al. |
| 2002/0186004 A1 | | 12/2002 | Prazeres da Costa |
| 2004/0032443 A1 | | 2/2004 | Moylan et al. |
| 2004/0075607 A1 | | 4/2004 | Cathey |
| 2004/0160233 A1 | | 8/2004 | Forster |
| 2004/0178267 A1 | | 9/2004 | Tsirline et al. |
| 2004/0215350 A1 | | 10/2004 | Roesner |

(Continued)

FOREIGN PATENT DOCUMENTS

JP       2003/076946         3/2003

(Continued)

*Primary Examiner*—Van T. Trieu

(57) ABSTRACT

Systems and methods provide location determination for the application of radio frequency identification (RFID) devices (e.g., performance evaluation of one or more RFID devices for various locations on an object to be associated with an RFID device). For example, in accordance with an embodiment of the present invention, an RFID test device includes a housing, an RFID device coupled to the housing, and a near field coupler contained at least partially within the housing and configured to communicate in a near field region with the RFID device.

21 Claims, 1 Drawing Sheet

U.S. PATENT DOCUMENTS

| | | |
|---|---|---|
| 2005/0045723 A1 | 3/2005 | Tsirline et al. |
| 2005/0068179 A1 | 3/2005 | Roesner |
| 2005/0150102 A1 | 7/2005 | Bosco et al. |
| 2006/0012387 A1 | 1/2006 | Shanks |
| 2006/0055530 A1* | 3/2006 | Wang et al. ............ 340/539.13 |
| 2006/0080819 A1* | 4/2006 | McAllister ................. 29/403.3 |

FOREIGN PATENT DOCUMENTS

| | | |
|---|---|---|
| JP | 2003/076947 | 3/2003 |
| JP | 2003/099719 | 4/2003 |
| JP | 2003/099720 | 4/2003 |
| JP | 2003/099721 | 4/2003 |
| JP | 2003/168082 | 6/2003 |
| JP | 2003/168098 | 6/2003 |
| JP | 2003/187213 | 7/2003 |
| JP | 2003/331220 | 11/2003 |
| WO | WO 00/28339 | 5/2000 |
| WO | WO 01/65517 | 9/2001 |
| WO | WO 01/67413 | 9/2001 |
| WO | WO 02/14884 | 2/2002 |
| WO | WO 02/088762 | 11/2002 |
| WO | WO 2004/084119 | 9/2004 |
| WO | WO 2004/088571 | 10/2004 |
| WO | WO 2004/095350 | 11/2004 |

* cited by examiner

RFID APPLICATION TEST SYSTEMS AND METHODS

TECHNICAL FIELD

This application claims the benefit of U.S. Provisional Patent Application No. 60/661,412 filed on Mar. 14, 2005 entitled "RFID Application Test Systems and Methods", which is incorporated herein by reference.

The present invention relates generally to radio frequency identification (RFID) applications and, more particularly, to RFID device application and testing.

BACKGROUND

Radio frequency identification (RFID) devices (e.g., RFID tags, RFID labels, RFID chips, or RFID inlays) are increasingly utilized in a wide variety of applications. For example, an RFID device is typically associated with a retail product for identification and tracking purposes (e.g., attached to a package of the retail product for supply chain management).

The responsibility for applying the RFID devices to, for example, retail product packaging is being placed increasingly on the supplier, with the process of the supplier applying the RFID devices known as source tagging. However, a major supplier may have thousands of different items, which need to have a suitable RFID device and mounting location determined, and this process may have to be repeated when changes are made to the product or packaging.

In general, an antenna of the RFID device may be viewed as having a near field region and a far field region. The near field region refers to a reactive near field (e.g., approximately $R \leq \lambda/2\pi$) and a radiating near field (e.g., approximately $R < 2D^2/\lambda$), while the far field region refers to a radiating far-field component (e.g., $R > 2D^2/\lambda$), where R is the distance from the antenna and D is the largest dimension of the antenna. Short-range testing of RFID devices generally involves testing within the near field region, while long-range testing generally involves testing within the far field region.

For a supplier, it may be difficult and/or time consuming to determine the suitable RFID device and optimum mounting for the RFID device on the retail product to provide the desired RFID operation. For example, the location determination may involve mounting the RFID device at a location on the retail product package and performing a corresponding long-range test on the RFID device (e.g., a free space, radiated test of the RFID device at a certain distance with a certain RFID reader power level) to determine the RFID device's performance at that location. This method is time consuming as the RFID device must be repeatedly mounted, tested, and then removed and remounted in another location for the subsequent test to determine the best relative location.

Furthermore, the long-range test must be performed with care to achieve accurate results and prevent skewed results. For example, the results may be adversely affected due to the test environment (e.g., interference from other co-located RFID reader systems) or a flawed test setup (e.g., where the path between the RFID reader and the RFID device has objects nearby, such as the operator carrying out the tests, which can cause reflections that affect tag performance). As a result, there is a need for improved methods for efficiently evaluating the performance of a particular RFID device and its optimum mounting location to an object (e.g., a product or packaged item).

SUMMARY

Systems and methods are disclosed herein to provide location determination for the application of radio frequency identification (RFID) devices (e.g., performance evaluation of one or more RFID devices for various locations on an object to be associated with an RFID device). For example, in accordance with an embodiment of the present invention, an RFID application test system is disclosed that provides for the rapid assessment of an acceptable or possibly best position for locating the RFID device on an object (e.g., a retail product or any other desired object to be associated with an RFID device).

As an example, in accordance with an embodiment of the present invention, the RFID application test system may employ a test device having an RFID device along with a coupler (e.g., a near-field coupler) linked to an RFID reader. A user may position the RFID device of the test device in different locations on the object to ascertain quickly the performance (e.g., relative performance) of the RFID device for each of the selected locations.

For example, the user may move (in a continuous fashion) the RFID device of the test device over the desired locations on the retail product to continuously assess the performance of the RFID device and quickly determine the best location for the RFID device and relative performance gained compared to less desirable locations. Furthermore, if the performance of the RFID device is determined based upon near field measurements, the RF radiation may be reduced along with possible interference from or to other systems or interference due to the test environment, such as the presence of the operator carrying out the test.

A further benefit of using the near field test method may be a reduction of radiated RF power from the test system, which will allow the tests to be carried out with less interference to other systems. For example, more than one near field test system may be operated in an area simultaneously to facilitate testing of products in parallel.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
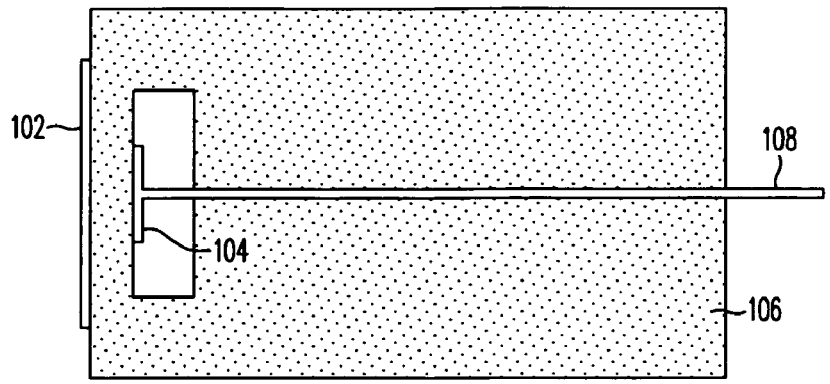
FIG. 1 shows a diagram illustrating an RFID test device in accordance with an embodiment of the present invention.

FIG. 1 shows a diagram illustrating an RFID test device 100 in accordance with an embodiment of the present invention. RFID test device 100 (also referred to herein as a test head) includes an RFID device 102, a coupler 104, a test block 106, and a communication path 108.

RFID device 102 represents any type of RFID device whose performance and placement needs to be determined with respect to an object to be associated with RFID device 102. For example, RFID device 102 may represent an RFID tag, an RFID label, an RFID chip, an RFID strap, or an RFID inlay that is to be placed on, near, within, or otherwise associated with an object (e.g., placed on or in close proximity to a product package).

Coupler 104 represents a near field coupling structure that is utilized by an RFID reader (not shown) via communication path 108 to monitor one or more parameters of RFID device 102. In this context, the phrase "near field" refers to the reactive near field region and/or radiating near field region (i.e., not the far field region). The coupling between coupler 104 and RFID device 102 may be primarily by an electric field, a magnetic field, or a combination of the electric field and the magnetic field. By employing near fields, the influence of the surrounding test environment is reduced during testing. Furthermore, interference to nearby systems is also reduced as the far field radiated power from coupler 104 (i.e., the near field coupler) is low relative to conventional higher power far field test techniques.

As an example, in accordance with an embodiment of the present invention, coupler 104 and/or RFID device 102 may be implemented in accordance with the techniques disclosed in U.S. patent application Ser. No. 10/367,515, filed Feb. 13, 2003, and entitled "RFID Device Tester and Method," which is incorporated herein by reference in its entirety. For this exemplary implementation, coupler 104 may couple, for example, using primarily an electric near field (e.g., in a capacitive fashion) to RFID device 102 to provide the desired information to the reader (e.g., regarding the performance of RFID device 102).

As another example, in accordance with an embodiment of the present invention, coupler 104 and/or RFID device 102 may be implemented in accordance with the techniques disclosed in U.S. patent application Ser. No. 10/882,947, filed Jul. 1, 2004, and entitled "RFID Device Preparation System and Method," which is incorporated herein by reference in its entirety. For this exemplary implementation, coupler 104 may couple, for example, using primarily an electric and/or magnetic near field (e.g., in a capacitive and/or inductive fashion) to RFID device 102 to provide the desired information to the reader (e.g., regarding the performance of RFID device 102).

Figure 2:
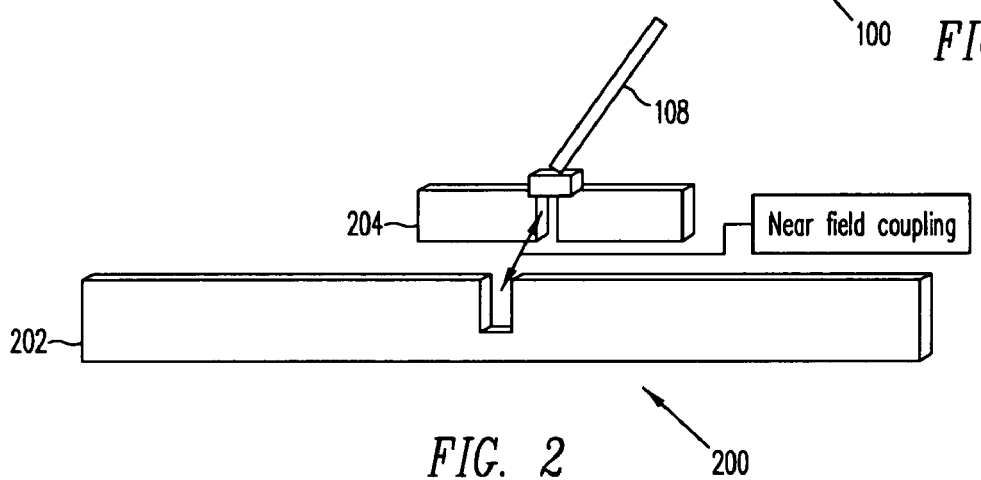
FIG. 2 shows a diagram illustrating exemplary near field coupling for an RFID test device in accordance with an embodiment of the present invention.

Referring briefly to FIG. 2, a diagram illustrates an exemplary near field coupling for an RFID test device 200 in accordance with an embodiment of the present invention. RFID test device 200, which may represent an exemplary implementation of RFID test device 100, includes an RFID device 202 (e.g., an RFID tag) and a coupler 204, with coupler 204 utilizing near field coupling to monitor or communicate with RFID device 202.

Communication path 108 of FIG. 1 may represent any type of desired communication path (e.g., a coaxial cable or other type of lead) between coupler 104 and the reader. Furthermore, communication path 108 may provide the proper termination to coupler 104 and provide an appropriate communication pathway (e.g., a balanced drive signal path) between coupler 104 and the reader.

Test block 106 (e.g., a housing) may represent a low dielectric constant material (e.g., polystyrene foam), with RFID device 102 attached to test block 106 and coupler 104 embedded at least partially within test block 106 (e.g., coupler 104 situated approximately 20 mm from RFID device 102). Communication path 108 may be routed through test block 106 to coupler 104.

Figure 3:
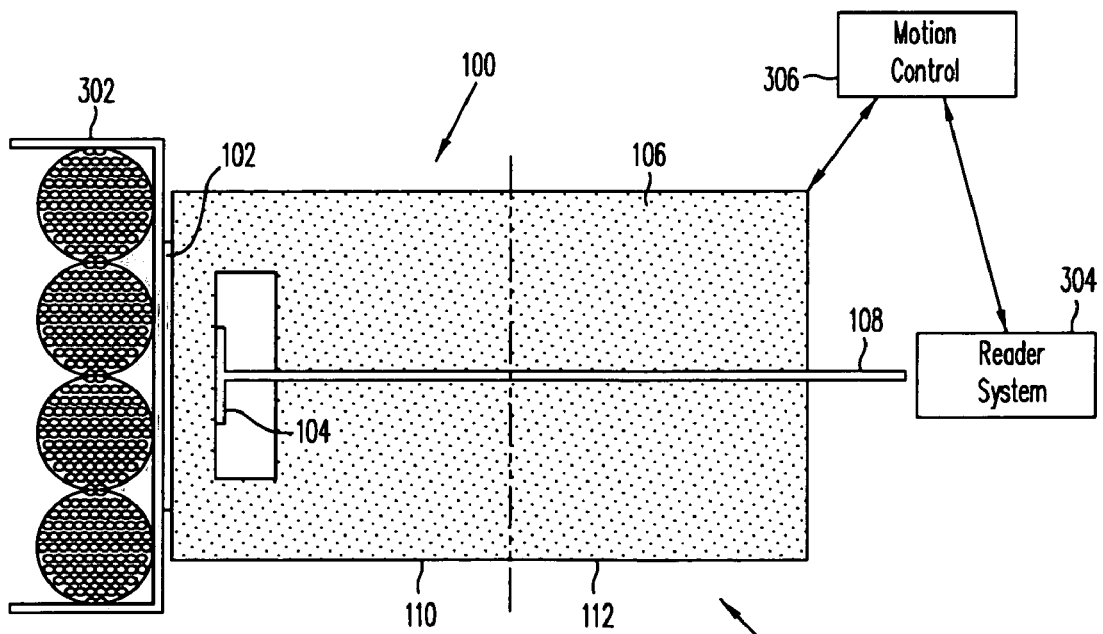
FIG. 3 shows a diagram illustrating an RFID test device system in accordance with an embodiment of the present invention.

FIG. 3 shows a diagram illustrating an RFID system 300 in accordance with an embodiment of the present invention. RFID system 300 may represent an exemplary test system and includes RFID test device 100, an object 302, and an RFID reader system 304. Object 302 may represent a single product or a package containing a number of products (e.g., a package of containers) or object 302 may represent any item to be associated with an RFID device (e.g., RFID device 102). RFID reader system 304 may represent any type of appropriate conventional system for reading RFID devices.

In general, RFID test device 100 may be held by a user performing the location determination test. For example, the user may hold test block 106 to place RFID device 102 against a surface of object 302 and to move RFID device 102 to various locations (e.g., possible mounting locations) on object 302. The performance of RFID device 102 may be monitored by RFID reader system 304 via coupler 104 to assess the performance of RFID device 102 at each of the various locations. Thus, the user may quickly determine the best mounting position for RFID device 102.

Furthermore, by performing these techniques for each type of RFID device to be considered for a desired application, the user may also determine the best type of RFID device (in addition to the best location for the RFID device) for the desired application. For example, there may be one RFID test device 100 for each corresponding type of RFID device 102 to be tested. Alternatively, RFID device 102 may be attached to test block 106 such that RFID device 102 may be removed and a different type of RFID device 102 attached to test block 106, as would be understood by one skilled in the art. Consequently, more than one type of RFID device 102 may be tested, with the performance results compared to determine the best type of RFID device 102 and the best location for mounting for a given application (e.g., for the locations and types of RFID devices tested).

The performance of RFID device 102, for example, may be determined based on read rate (e.g., readability) or on its performance based on various power levels of RFID reader (e.g., minimum power level of RFID reader that still provides proper operation of RFID device 102). For example, a test based on power levels may determine the minimum RF power level (at a known frequency) applied to coupler 104 that provides sufficient energy to RFID device 102 (in proximity to object 302) to operate and correctly receive command sequences sent to it (e.g., verified by RFID device 102 responding back by modifying its impedance with a data carrying sequence, a process commonly referred to as backscatter modulation).

As another example, to aid the user while performing the test on the various locations on object 302, an audible tone may be provided (e.g., by the RFID reader) as an indication of the performance of RFID device 102. For example, as RFID device 102 is moved around the surface of the object, a rising tone may indicate that the performance of RFID device 102 is improving, while a falling tone may indicate that the performance of RFID device 102 is deteriorating.

The test process may also be automated. For example, RFID device 102 may be moved over the surface or in close proximity to object 302 using a mechanical system capable of computer controlled displacement in two planes (e.g., threedimensional movement). As an example, in accordance with an embodiment of the present invention, RFID system 300 (FIG. 3) is shown with an optional motion control system 306, which may represent any type of system for controlling the placement or location of RFID device 102 (e.g., relative to object 302). RFID reader system 304 may also be incorporated into motion control system 306. Thus, RFID reader system 304 and motion control system 306 may be combined, for example, into a computer or other processor-based system for controlling the location of and communication with RFID device 102. Furthermore, the test process may record the position of RFID device 102, such as with a video camera and later correlate the performance against position. Consequently, the user may quickly determine the location on object 302 where the performance of RFID device 102 is acceptable or relatively best among the locations tested.

The dimensions of test block 106 may be selected to maintain a minimum distance between a test point (e.g., the region around RFID device 102 and coupler 104) and a hand of the user holding test block 106. For example, the minimum distance may be approximately equal to or greater than one-half wavelength of the RFID test frequency being employed for the RFID test (e.g., given that the RFID test frequency is high enough to reasonably allow such a constraint). The effect of a reflecting or interfering object at the one-half wavelength distance is to some extent cancelled, thus reducing interference with RFID device 102. In general, the measured performance and test results are more accurate as the distance increases between potentially interfering objects (e.g., an operator holding RFID test device 100) and RFID device 102.

A shield (e.g., a metal shield) or similar device as would be understood by one skilled in the art may be included as part of test block 106 to maintain a desired minimum distance between the test point and any potential interferences (e.g., the user's hand holding test block 106). In addition to or as an alternative, in accordance with an embodiment of the present invention, test block 106 may comprise two sections, indicated as sections 110 and 112 in FIG. 3. Section 110 is in immediate proximity to RFID device 102 and coupler 104 and, for example, may be formed as a low dielectric constant and low loss material (e.g., polystyrene foam of a known density). Section 112 is located farther from RFID device 102 relative to section 110 and may be formed with a material that absorbs RF energy (e.g., a foam loaded with conducting and/or magnetic materials). Sections 110 and 112 (a hybrid foam block), which form test block 106 for this exemplary implementation, may further reduce interaction with the operator or user of RFID test device 100.

As an alternative to forming test block 106 as sections 110 and 112, in accordance with an embodiment of the present invention, test block 106 may be formed from a material whose parameters (or variable set of parameters) gradually change as the distance from RFID device 102 increases. For example, the parameters may include one or more of the following: average dielectric constant, relative magnetic permeability, and loss (i.e., the tendency to dissipate RF energy). One or more of these parameters may be increased gradually as the distance from RFID device 102 increases, which will make the effective distance between RFID device 102 and the point at which RFID device 102 is being held to appear greater, without significantly altering the tag performance.

Systems and methods are disclosed herein to provide location determination for an RFID device on an object. For example, in accordance with an embodiment of the present invention, an RFID test device is disclosed that allows a rapid assessment of the RFID device's performance at various locations on the object to determine the correct location for attaching the RFID device.

The techniques disclosed herein, for example, may significantly reduce the time required to ascertain the correct location for placing an RFID device on an object. Consequently, a products supplier may greatly reduce its time and effort in determining RFID device placement for numerous products and packaging by utilizing the disclosed techniques. Furthermore, the techniques may be performed quickly, reliably, and in a straightforward manner by relatively unskilled personnel as compared to conventional techniques that may require specialized training and a specific test environment to perform lengthy test operations.

For example, conventional techniques utilizing far field radiating sources tend to interact with the environment and possibly with a test operator attempting to perform the test and ascertain a correct position for the RFID device. Thus, the test operator must be specifically trained regarding the test and the proper test environment to obtain reliable and accurate results. In contrast, in accordance with an embodiment of the present invention, a near field coupling technique is employed that allows a user of the test device to ascertain the desired location for the RFID device without requiring a specific test environment as may be required with the conventional techniques.

In general, there is a correlation between the measured performance in a near field system and a far field system. Consequently, the near field techniques disclosed and employed herein may be utilized to predict RFID device performance in near or far field applications and provide approximate relative position and performance indications without requiring the actual mounting (e.g., and associated dielectric contact) of the RFID device to the object. However, once the approximate best location is determined for the RFID device being tested, a similar type of RFID device may be mounted at the determined best location (e.g., via releasable transfer tape) and a far field test performed to verify the test results and confirm that the desired RFID performance is obtained.

Embodiments described above illustrate but do not limit the invention. It should also be understood that numerous modifications and variations are possible in accordance with the principles of the present invention. Accordingly, the scope of the invention is defined only by the following claims.

I claim:

1. A radio frequency identification (RFID) test device comprising:
   a housing;
   an RFID device coupled to the housing;
   a near field coupler contained at least partially within the housing and configured to communicate in a near field region with the RFID device; and
   a communication path coupled to the near field coupler, wherein the housing is adapted to be held to position the RFID device at one or more locations relative to an object to determine an acceptable position for locating an RFID device on the object.

2. The RFID test device of claim 1, further comprising an RFID reader coupled to the communication path and adapted to communicate with the RFID device through the near field coupler.

3. The RFID test device of claim 1, wherein the RFID device comprises at least one of an RFID tag, an RFID label, an RFID chip, an RFID strap, and an RFID inlay.

4. The RFID test device of claim 1, wherein the near field coupler communicates with the RFID device in the near field region of the RFID device by at least one of an electric field and a magnetic field.

5. The RFID test device of claim 1, wherein the housing comprises a low dielectric constant material.

6. The RFID test device of claim 1, wherein the housing comprises a first section comprising a low dielectric constant material and a second section comprising a radio frequency absorbing material.

7. The RFID test device of claim 1, wherein the housing comprises a material having one or more parameters comprising at least one of an average dielectric constant, a relative magnetic permeability, and a radio frequency energy loss, with the one or more parameters varying relative to a distance from the RFID device.

8. A radio frequency identification (RFID) system comprising:
    an RFID device;
    a coupler adapted to communicate in a near field region with the RFID device;
    means for housing the coupler in close proximity to the RFID device coupled to the housing means;
    a communication path coupled to the coupler; and
    an RFID reader coupled to the communication path and adapted to communicate with the RFID device through the coupler, wherein the housing means is adapted to be held to position the RFID device at one or more locations relative to an object.

9. The REID system of claim 8, wherein the coupler communicates with the RFID device in the near field region of the RFID device by at least one of an electric field and a magnetic field.

10. The RFID system of claim 8, wherein the RFID device comprises at least one of an RFID tag, an RFID label, an RFID chip, an RFID strap, and an RFID inlay.

11. The RFID system of claim 8, wherein the RFID reader is adapted to determine a performance of the RFID device at the one or more locations.

12. The RFID system of claim 11, wherein the RFID reader provides an audible tone indicating the performance of the RFID device.

13. The RFID system of claim 8, further comprising means for moving the RFID device to one or more locations on or relative to an object and determining a performance of the RFID device at the one or more locations.

14. A method of determining a mounting location on an object for a first radio frequency identification (RFID) device, wherein the first RFID device is coupled to a near field test device to determine the mounting location, the method comprising:
    moving the first RFID device, coupled to the near field test device, to a first location associated with the object;
    communicating with the first RFID device in the near field region with the near field test device to determine the performance of the first RFID device at the first location; and
    moving the first RFID device, coupled to the near field test device, to a second location associated with the object; and
    communicating with the first RFID device in the near field region with the near field test device to determine the performance of the first RFID device at the second location.

15. The method of claim 14, wherein the near field test device communicates with the first RFID device in the near field region through at least one of an electric field and a magnetic field.

16. The method of claim 14, wherein the performance is determined based on at least one of a read rate and a power level.

17. The method of claim 14, further comprising comparing the performance of the first RFID device at the first location and the second location to determine the mounting location.

18. The method of claim 14, further comprising:
    comparing the performance of the first RFID device at the first location and the second location to determine the mounting location;
    mounting at least one of the first RFID device and a similar one of the first RFID devices at the determined mounting location; and
    performing a far field test to verify the performance at the determined mounting location.

19. The method of claim 14, further comprising:
    removing the first RFID device from the near field test device;
    coupling a second RFID device to the near field test device;
    moving the second RFID device, coupled to the near field test device, to the first location;
    communicating with the second RFID device in the near field region with the near field test device to determine the performance of the second RFID device at the first location; and
    moving the second RFID device, coupled to the near field test device, to the second location; and
    communicating with the second RFID device in the near field region with the near field test device to determine the performance of the second RFID device at the second location.

20. The method of claim 19, further comprising comparing the performance of the first RFID device at the first location and the second location to the performance of the second RFID device at the first location and the second location to determine the mounting location and determine which of the first RFID device and the second RFID device to mount at the determined mounting location.

21. The method of claim 14, wherein the first location and the second location are on a surface of the object.

* * * * *